United States Patent
Huynh

(10) Patent No.: US 6,838,930 B2
(45) Date of Patent: Jan. 4, 2005

(54) SWITCHED CAPACITOR AMPLIFIER WITH HIGH THROUGHPUT ARCHITECTURE

(75) Inventor: Phuong T. Huynh, Annandale, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 82 days.

(21) Appl. No.: 10/305,067

(22) Filed: Nov. 27, 2002

(65) Prior Publication Data

US 2003/0107432 A1 Jun. 12, 2003

Related U.S. Application Data

(60) Provisional application No. 60/333,518, filed on Nov. 28, 2001.

(51) Int. Cl.[7] .................................... H03F 1/02
(52) U.S. Cl. ............................. 330/9; 330/69
(58) Field of Search ................. 330/9, 69, 51, 330/107, 109; 327/124; 333/173

(56) References Cited

U.S. PATENT DOCUMENTS

| | | | | |
|---|---|---|---|---|
| 4,403,195 A | * | 9/1983 | Wurzburg | 330/9 |
| 4,496,858 A | * | 1/1985 | Smith | 327/102 |
| 4,806,874 A | * | 2/1989 | Michel | 330/9 |
| 5,479,130 A | * | 12/1995 | McCartney | 327/341 |

* cited by examiner

Primary Examiner—Henry Choe
(74) Attorney, Agent, or Firm—Posz & Bethards, PLC

(57) ABSTRACT

A switched capacitor amplifier includes a pair of output capacitors, providing high throughput suitable for pip-estaged circuit applications. During operation, the amplifiers may generate an evaluation output once per clock cycle. During a first clock cycle, one of the two output capacitors holds an evaluation potential to be output from the amplifier and the second output capacitor both precharges and evaluates. During a second clock cycle, the roles of the output capacitors reverse and the second output capacitor holds the evaluation potential and the first output capacitor precharges and evaluates. The invention is suitable for use with a variety of amplifier topologies.

17 Claims, 6 Drawing Sheets

100

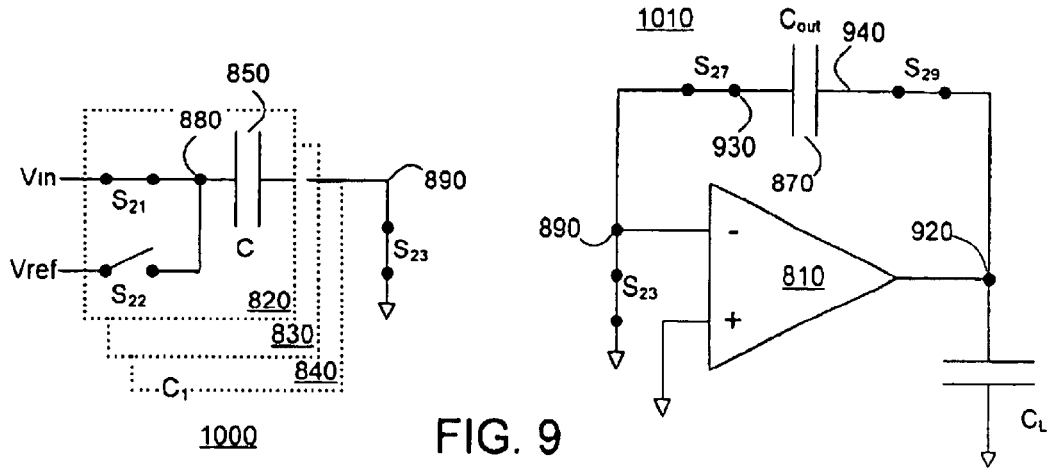
FIG. 9
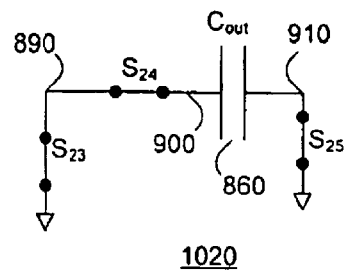
FIG. 10
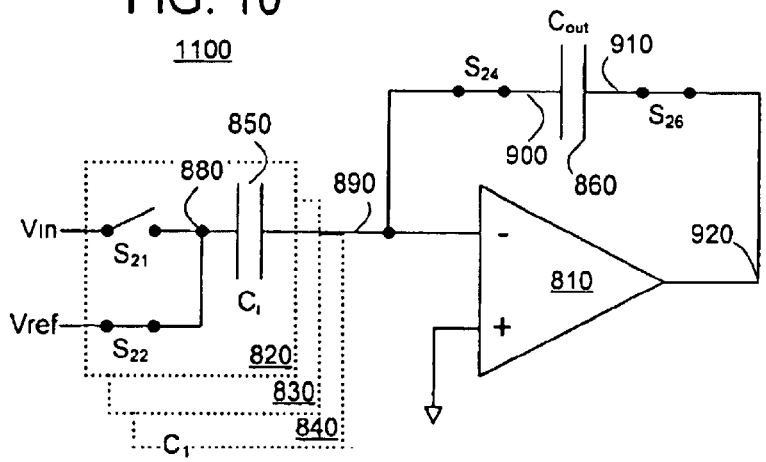

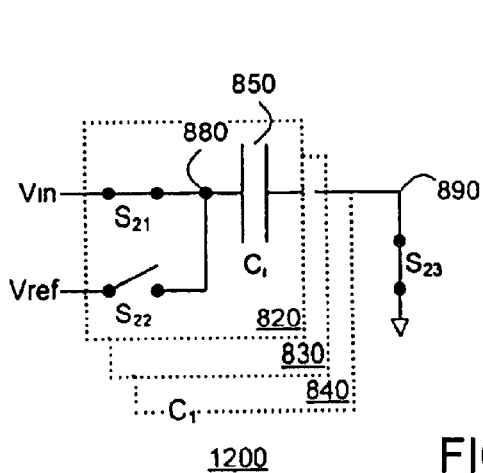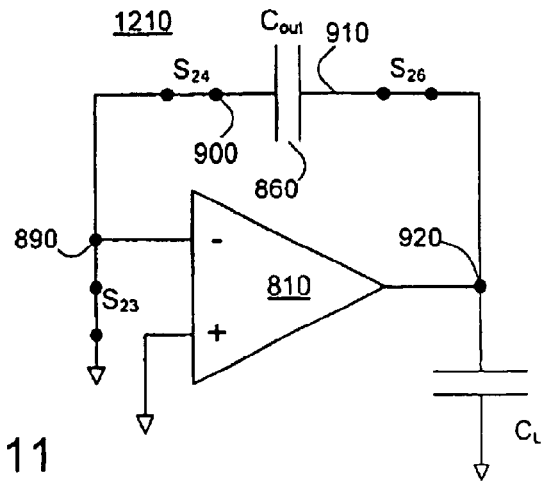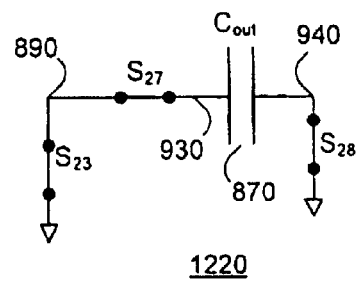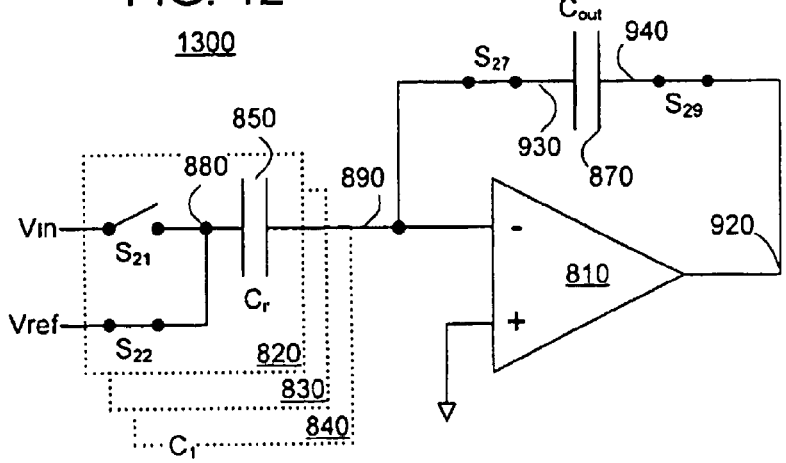
FIG. 11
FIG. 12

1300

SWITCHED CAPACITOR AMPLIFIER WITH HIGH THROUGHPUT ARCHITECTURE

CROSS-REFERENCE TO RELATED PATENT DOCUMENTS

The present document claims the benefit of the earlier filing date of commonly owned, co-pending U.S. provisional patent application Ser. No. 60/333,518 filed Nov. 28, 2001, entitled SWITCHED CAPACITOR AMPLIFIER WITH HIGH THROUGHPUT ARCHITECTURE, the contents of which are incorporated by reference.

BACKGROUND

The present invention relates to switched capacitor amplifiers and applications therefor.

Switched capacitor amplifiers are known. Typically, they include one or more input branches each having an input capacitor selectively switched to an input voltage source and a reference voltage source. The branches may terminate at a second terminal of their respective input capacitors, which may be input to a first terminal of an operational amplifier (colloquially, "op amp"). An output capacitor may bridge between an output of the op amp and the first terminal thereof. A second terminal of the op amp may be tied to ground.

Operation of the traditional switched capacitor amplifier consumes two cycles of a driving clock signal. During the first cycle, the amplifier precharges and evaluates, generating a potential across the output capacitor. During the second cycle, the potential of the output capacitor is held at the amplifier output while another circuit element samples it.

The two-cycle operation of the switched capacitor amplifier is disadvantageous, particularly in pipestaged applications where a number of the switched capacitor amplifiers may be tied to one another in a cascaded relationship. If an input potential were applied to a first stage during a first cycle, an output would be available to the second stage in a second clock cycle. The first stage, however, could not accept a new input until the third clock cycle and could not generate a second output until the fourth clock cycle. This delay reduces throughput of an entire pipestaged system; it would be far better for a switched capacitor amplifier to generate an output in each and every clock cycle of operation.

While it would be possible to use existing architectures for switched capacitor amplifier to generate an output in each clock cycle, it would be necessary to increase the size and bulk of the components thereof, notably the op amp and output capacitor. Increased size and bulk of these components also would be disadvantageous. Larger components consume more power and are difficult (at least, expensive) to manufacture in integrated circuits. Accordingly, there is a need for a new architecture for switched capacitor amplifiers that can achieve increased throughput while permitting small component size.

BRIEF DESCRIPTION OF THE DRAWINGS

FIG. 9 illustrates circuit response of the amplifier of FIG. 7 during time $T_{20}$ according to an embodiment of the invention.

FIG. 10 illustrates circuit response of the amplifier of FIG. 7 during time $T_{21}$ according to an embodiment of the present invention.

FIG. 11 illustrates circuit response of the amplifier of FIG. 7 during time $T_{20}$ according to an embodiment of the invention.

FIG. 12 illustrates circuit response of the amplifier of FIG. 7 during time $T_{21}$ according to an embodiment of the present invention.

DETAILED DESCRIPTION

Embodiments of the present invention provide a switched capacitor amplifier that finds application in a pipestaged analog to digital converter. During operation, the amplifiers may generate an evaluation output once per clock cycle. By comparison, traditional architectures of switched capacitor amplifiers generate evaluation outputs once every two clock cycles. The amplifiers include a pair of output capacitors. During a first clock cycle, one of the two output capacitors holds an evaluation potential to be output from the amplifier and the second output capacitor both precharges and evaluates. During a second clock cycle, the roles of the output capacitors reverse and the second output capacitor holds the evaluation potential and the first output capacitor precharges and evaluates. The switched capacitor amplifiers are ideal for application in high throughput circuits such as pipestaged analog to digital converters.

Figure 1:
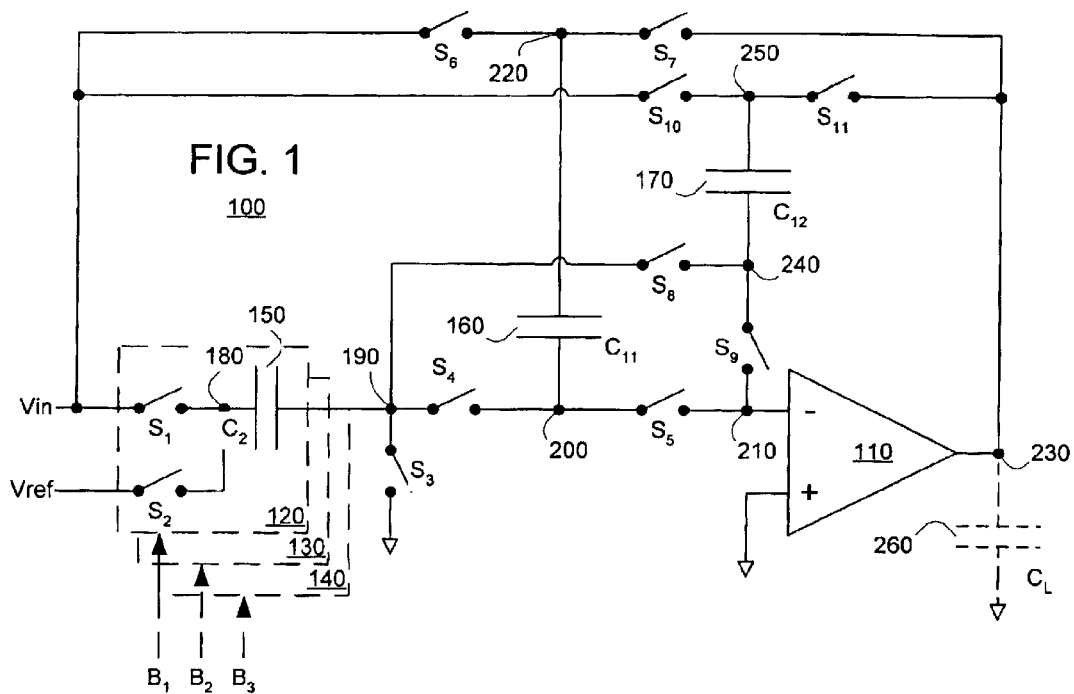
FIG. 1 is a diagram of a switched capacitor amplifier according to an embodiment of the present invention.

FIG. 1 is a diagram of a switched capacitor amplifier 100 according to an embodiment of the present invention. The amplifier 100 may include an operational amplifier 110 and one or more input branches 120–140 (only three branches are shown in this representative example) each having a capacitor 150 (shown only for the first branch 120). The amplifier 100 includes a pair of capacitors 160, 170 each having a predetermined capacitance $C_{out}$.

Each input branch i may include its own capacitor 150 having a capacitance $C_i$. A first terminal (node 180) of the capacitor 150 may be connected to a first input potential $V_{in}$ via a first switch $S_1$ and to a second potential $V_{ref}$ via a second switch $S_2$. A second terminal (node 190) of the capacitor may be coupled to ground via switch $S_3$. In practice, a single ground switch $S_3$ may be coupled to capacitors 150 from all input branches 120–140.

A first terminal of the first capacitor 160 forms an intermediate node 200 that is connected to node 190 via a switch $S_4$ and to a first input of the operational amplifier 100 (node 210) via a switch $S_5$. A second terminal of the first capacitor 160 forms another intermediate node 220. The intermediate node 220 may be connected to the $V_{in}$ potential via a switch $S_6$ and to an output of the operational amplifier 100 (node 230) via a switch $S_7$.

A first terminal of the second capacitor 170 forms another intermediate node 240 that is connected to node 190 via a switch $S_8$ and to the first input of the operational amplifier 100 (node 210) via a switch $S_9$. A second terminal of the second capacitor 170 forms another intermediate node 250. The intermediate node 250 may be connected to the $V_{in}$ potential via a switch $S_{10}$ and to the output of the operational amplifier 100 (node 230) via a switch $S_{11}$.

Typically, an output 230 of the amplifier 100 is coupled to a load 260 having its own impedance. The impedance of the load is represented as $C_L$.

Figure 2:
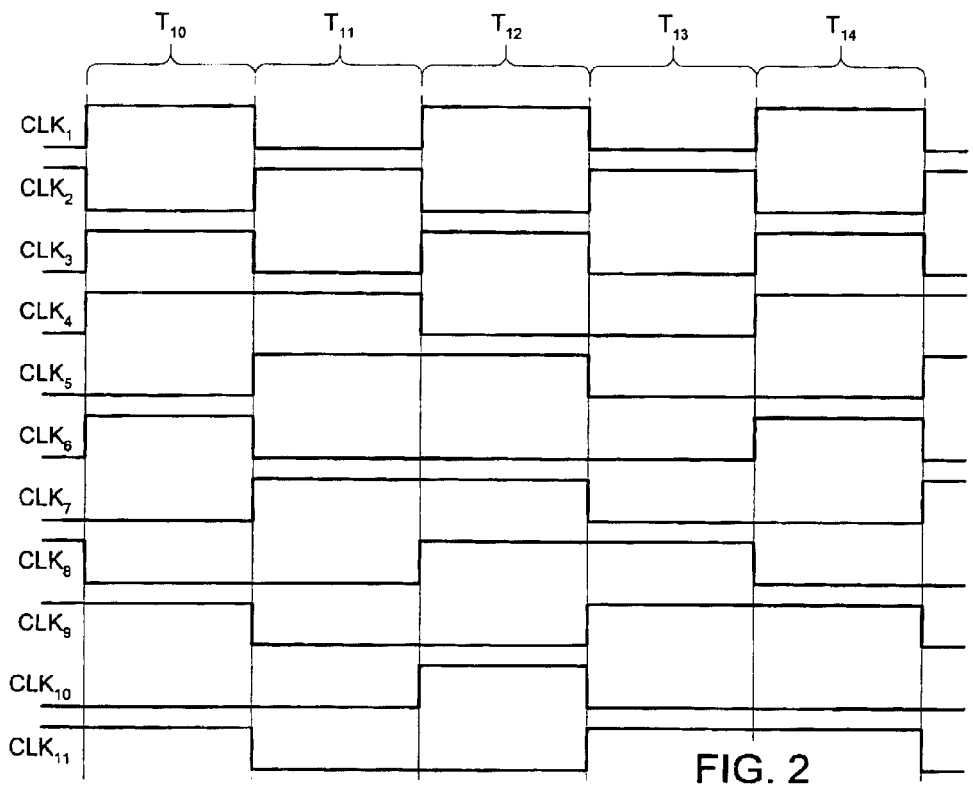
FIG. 2 is a timing diagram illustrating control signals that may be applied to the amplifier of FIG. 1 according to an embodiment of the present invention.

FIG. 2 is a timing diagram illustrating control signals that may be applied to switches of amplifier 100 according to an embodiment of the present invention. Switch $S_1$ and $S_3$ may be controlled by a 50% duty cycle clock $CLK_1$ having a predetermined clock rate. Characteristics of other clock signals illustrated in FIG. 1 are described with reference to the $CLK_1$ signal, which shall be called the "base clock" for the instant discussion. Switches $S_2$ and $S_3$ also may be controlled by 50% duty cycle clocks having the same rate as the base clock $CLK_1$. The clock $CLK_2$ for switch $S_2$ may be inverted with respect to the base clock $CLK_1$ (or delayed with respect to it by one-half a clock cycle). The clock $CLK_3$ for switch $S_3$ simply may be a replica of the base clock.

Clock CLK4 controls switch $S_4$. CLK4 may be a 50% duty cycle clock, one that has half the clock rate of the base clock. Thus, FIG. 2 illustrates clock CLK4 being high for the periods beginning at times $T_{10}$ and $T_{11}$ and being low during the periods beginning at times $T_{12}$ and $T_{13}$.

Clock CLK5 controls switch $S_5$. CLK5 may be a 50% duty cycle clock, one that has half the clock rate of the base clock. CLK5 may be delayed with respect to CLK4 by one-half a cycle of the base clock. Thus, FIG. 2 illustrates CLK5 being low during time $T_{10}$, being high during times $T_{11}$ and $T_{12}$ and being low during time $T_{14}$.

Clock CLK6 controls switch $S_6$. The CLK6 clock may be a pulsed clock, one that is high, for one phase of the base clock and low at all other times. The CLK6 clock is shown as being high during time $T_{10}$ and low during times $T_{11}$–$T_{13}$.

Clock CLK7 controls switch $S_7$. CLK7 may be a 50% duty cycle clock, one that has half the clock rate of the base clock. $CLK_7$ may be delayed with respect to $CLK_4$ by one-half a cycle of the base clock. Thus, FIG. 2 illustrates $CLK_7$ being low during time $T_{10}$, being high during times $T_{11}$ and $T_{12}$ and being low during time $T_{14}$.

Clock CLK8 controls switch $S_8$. Clock $CLK_8$ may be a 50% duty cycle clock that is inverted with respect to the $S_4$ clock. Thus, FIG. 2 illustrates the $S_8$ clock being low during times $T_{10}$ and $T_{11}$ and high at times $T_{12}$ and $T_{13}$.

Clock CLK9 controls switch $S_9$. Clock CLK9 may be a 50% duty cycle clock that is inverted with respect to the $S_5$ clock. Thus, FIG. 2 illustrates clock $CLK_9$ as high during time $T_{10}$, low during times $T_{11}$ and $T_{12}$ and high again at time $T_{13}$.

Clock CLK10 controls switch $S_{10}$. Clock CLK10 may be a pulsed clock one that is high for one phase the base clock. FIG. 2 illustrates clock CLK10 being low during times $T_{10}$ and $T_{11}$, high during time $T_{12}$ and low again during time $T_{13}$.

Clock CKL11 controls switch $S_{11}$. Clock $CLK_{11}$ may be a 50% duty cycle clock that is inverted with respect to the $S_5$ clock. Thus, FIG. 2 illustrates clock $CLK_{11}$ as high during time $T_{10}$, low during times $T_{11}$ and $T_{12}$ and high again at time $T_{13}$.

In the amplifier of FIG. 1, the switches $S_1$–$S_{11}$ may be controlled to be closed (conductive) when the clocking input thereto is high and open (nonconductive) when the clocking input is low. Table 1 below illustrates the response of these switches in response to the inputs illustrated in FIG. 2:

TABLE 1

|  | $T_{10}$ | $T_{11}$ | $T_{12}$ | $T_{13}$ | $T_{14}$ |
|---|---|---|---|---|---|
| Switch $S_1$ | Open | Closed | Open | Closed | Open |
| Switch $S_2$ | Closed | Open | Closed | Open | Closed |
| Switch $S_3$ | Open | Closed | Open | Closed | Open |
| Switch $S_4$ | Open | Open | Closed | Closed | Open |
| Switch $S_5$ | Closed | Open | Open | Closed | Closed |
| Switch $S_6$ | Open | Closed | Closed | Closed | Open |
| Switch $S_7$ | Closed | Open | Open | Closed | Closed |
| Switch $S_8$ | Closed | Closed | Open | Open | Closed |
| Switch $S_9$ | Open | Closed | Closed | Open | Open |
| Switch $S_{10}$ | Closed | Closed | Open | Closed | Closed |
| Switch $S_{11}$ | Open | Closed | Closed | Open | Open |

Figure 3:
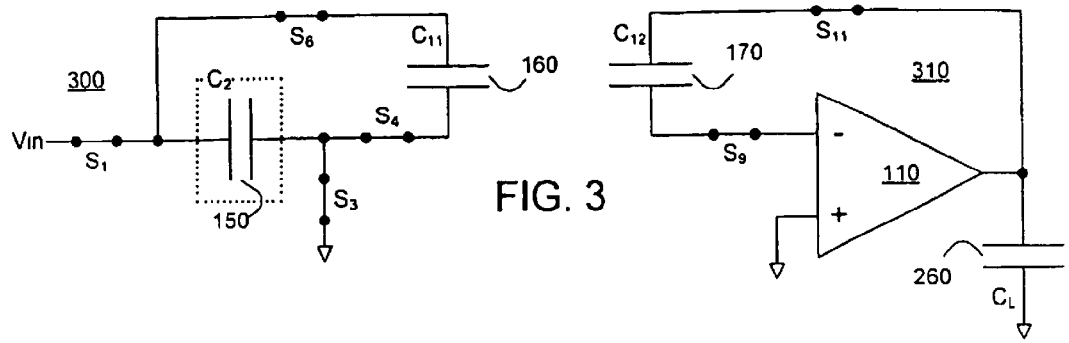
FIG. 3 illustrates circuit response of the amplifier of FIG. 1 during time $T_{10}$, according to an embodiment of the present invention.

FIG. 3 illustrates circuit response of the amplifier 100 during time $T_{10}$, according to an embodiment of the present invention. At this time, the switches essentially split the amplifier 100 into two separate circuit stages 300, 310. Switches $S_1$ and $S_6$ are closed, placing first terminals of the capacitors 150, 160 in contact with the input potential $V_{in}$. Switches $S_3$ and $S_4$ also are closed, placing second terminals of the capacitors 150, 160 in contact with ground. Thus, each capacitor 150, 160 charges until the potential drop across each is equal to $V_{in}$. This circuit connection precharges the capacitors 150, 160.

Simultaneously, switches $S_9$ and $S_{11}$ are closed, creating an output loop of the amplifier from capacitor 170 and the load capacitor $C_L$ 260. Thus, any potential developed across the capacitor 170 prior to time $T_{10}$ is transferred to the load capacitor 260. During this time, the potential of the capacitor 170 is said to be "held" for sampling by the load.

During time $T_{10}$, switches $S_2$, $S_5$, $S_7$–$S_8$ and $S_{10}$ are open. These switches cause the two sub-circuits 300, 310 to be isolated from one another during time $T_{10}$.

Figure 4:
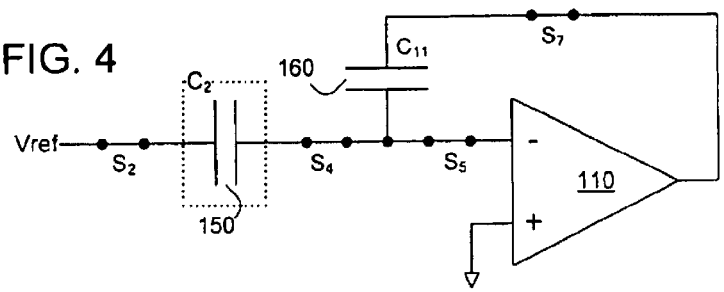
FIG. 4 illustrates circuit response of the amplifier of FIG. 1 during time $T_{11}$, according to an embodiment of the present invention.

FIG. 4 illustrates circuit response of the amplifier 100 during time $T_{11}$, according to an FIG. 4 illustrates circuit response of the amplifier 100 during time $T_{11}$ according to an embodiment of the present invention. During this time, the switches $S_2$, $S_4$, $S_5$ and $S_7$ are closed, providing an evaluating path from $V_{ref}$ to the output terminal (node,230) that traverses capacitors 150 and 160. During this, time, the output voltage at the output terminal 230 is:

$$V_{out} = \frac{C_2 + C_{11}}{C_{11}}(V_{in} - V_{ref}) \tag{1}$$

Switches $S_1$, $S_3$, $S_6$, $S_8$, $S_9$, $S_{10}$ and $S_{11}$ all may be open during time $T_{11}$.

Figure 5:
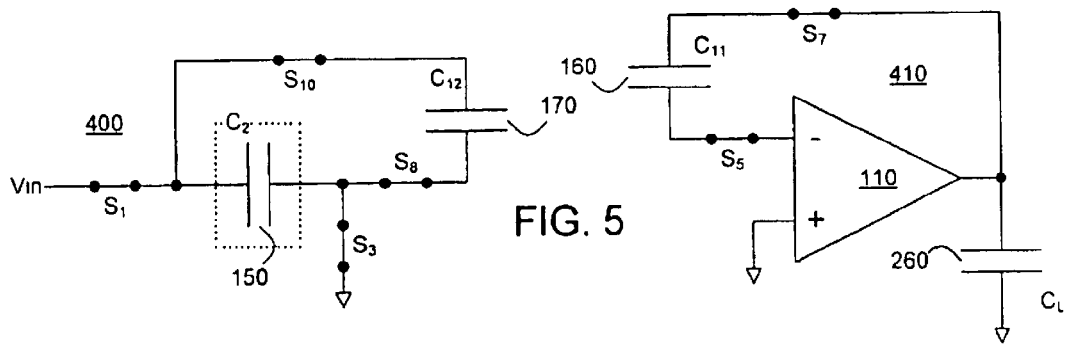
FIG. 5 illustrates circuit response of the amplifier of FIG. 1 during time $T_{12}$, according to an embodiment of the present invention.

FIG. 5 illustrates circuit response of the amplifier 100 during time $T_{12}$, according to an embodiment of the present invention. During this time, in a manner similar to that shown in FIG. 3, the switches essentially divided the amplifier into two sub-circuits 400, 410. Switches $S_1$ and $S_{10}$ are closed, placing first terminals of the capacitors 150, 170 in contact with the input potential $V_{in}$. Switches $S_3$ and $S_8$ also are closed, placing second terminals of the capacitors 150, 170 in contact with ground. Thus, each capacitor 150, 170 charges until the potential drop across each is equal to $V_{in}$. This circuit connection precharges the capacitors 150, 170.

Simultaneously, switches $S_5$ and $S_7$ are closed, creating an output loop of the amplifier 100 from capacitor 160 and the load capacitor 260. Thus, the potential developed across the capacitor 160 during time $T_{11}$ is transferred to the load capacitor 260. During this time, the potential of the capacitor 160 is held for sampling by the load 260.

During time $T_{12}$, switches $S_2$, $S_4$, $S_6$, $S_9$ and $S_{11}$ may be open. These switches cause the two sub-circuits 400, 410 to be isolated from one another during time $T_{12}$.

Figure 6:
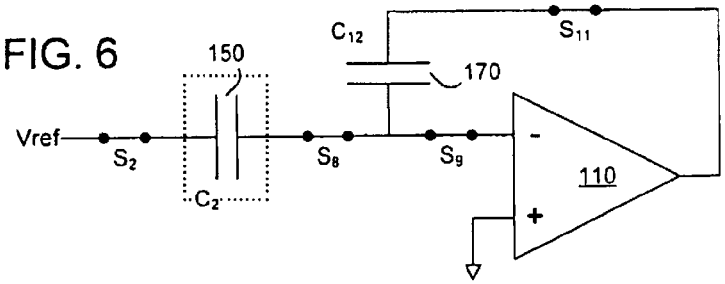
FIG. 6 illustrates circuit response of the amplifier of FIG. 1 during time $T_{13}$, according to an embodiment of the present invention.

FIG. 6 illustrates circuit response of the amplifier 100 during time $T_{13}$, according to an embodiment of the present invention. During this time, the switches $S_2$, $S_8$, $S_9$ and $S_{11}$ may be closed, providing an evaluation path from $V_{ref}$ to the output terminal (node 230) that traverses capacitors 150 and 170. During this time, the output voltage at the output terminal 230 may be governed by equation 1 above. Switches $S_1$, $S_3$, $S_4$, $S_5$, $S_6$, $S_7$ and $S_{10}$ all may be open during time $T_{11}$.

Returning to FIG. 1, it can be seen that the architecture of the amplifier 100 advantageously permits an evaluation potential to be available to a load 260 once per clock cycle. Thus, it can contribute to higher throughput in a pipelined processing structure such as a pipelined analog to digital converter. In a first clock cycle, one of the output capacitors (say, 160) holds its output for the load 260 while the other capacitor 170 precharges and evaluates. The precharging capacitor 170 holds its output for the load in the next clock cycle, while the first capacitor 160 precharges and evaluates. By contrast, traditional circuit switched capacitor amplifiers have only one output capacitor. They may operate according to a two clock cycle pattern in which a first cycle is consumed precharging and evaluating across the capacitor and a second stage is consumed holding the output for the load.

Figure 7:
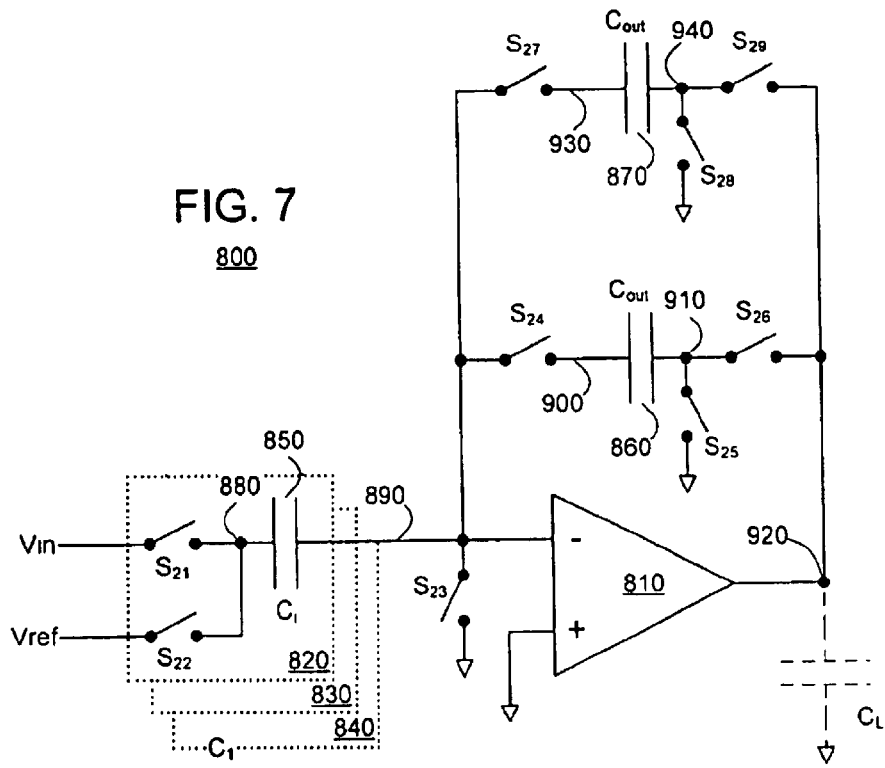
FIG. 7 is a circuit diagram of a circuit switched amplifier according to another embodiment of the present invention.

FIG. 7 is a circuit diagram of a circuit switched amplifier 800 according to another embodiment of the present invention. In this embodiment, the amplifier 800 may include an operational amplifier 810 and one or more input branches 820–840 each having a capacitor 850. The amplifier 800 also may include a pair of output capacitors 860, 870.

Each input branch i may include its own capacitor 850 having a capacitance $C_i$. A first terminal (node 880) of the capacitor 850 may be connected to a first input potential $V_{in}$ via a first switch $S_{21}$ and to a second potential $V_{ref}$ via a second switch $S_{22}$. A second terminal (node 890) of the capacitor may be coupled to ground via switch $S_{23}$. In practice, a single ground switch $S_{23}$ may be coupled to capacitors 850 from all input branches 820–840.

A first terminal of the first output capacitor 860 forms an intermediate node 900 that may be connected to node 890 via a switch $S_{24}$. A second terminal of the first capacitor 860 forms another intermediate node 910. The second intermediate node 910 may be connected to ground via a switch $S_5$ and to an output terminal 920 of the amplifier 800 via another switch $S_6$.

A first terminal of the second capacitor 870 forms another intermediate node 930 that is connected to node 890 via a switch $S_{27}$. A second terminal of the second capacitor 870 may forms another intermediate node 940. The intermediate node 940 may be connected to ground via a switch $S_{28}$ and to the output terminal 920 via a switch $S_{29}$.

As in the amplifier of FIG. 1, the output terminal 920 may be coupled to a load 930 which may be characterized by its own load impedance ($C_L$).

Figure 8:
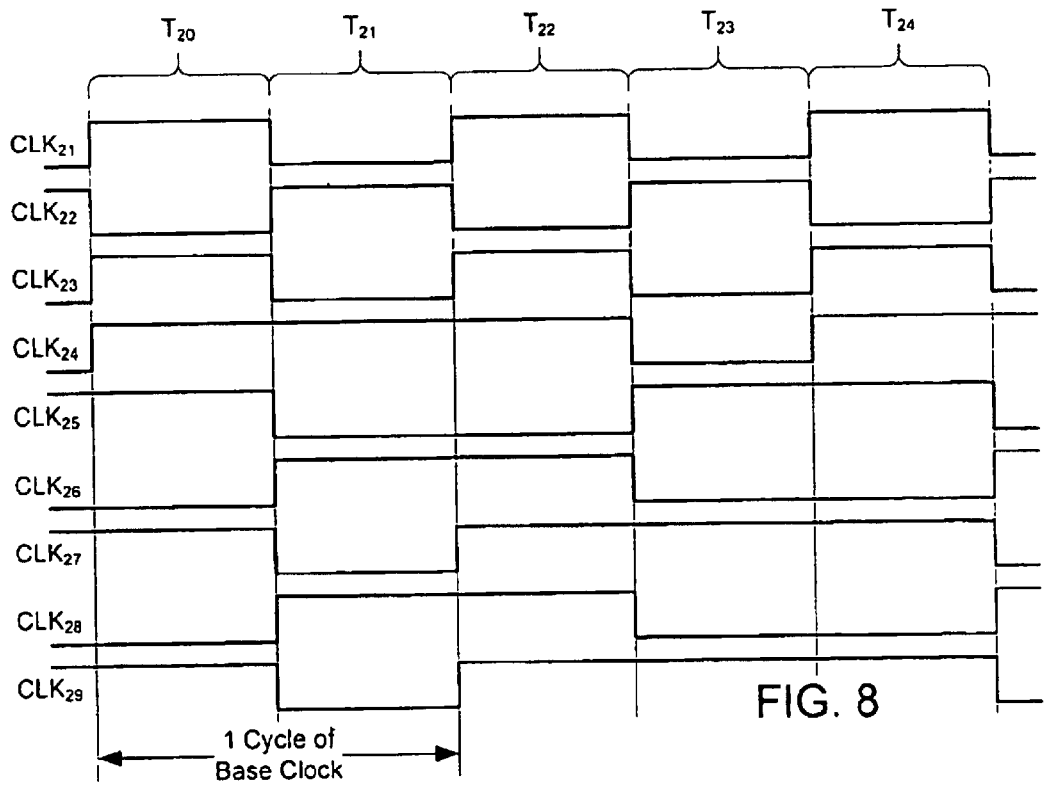
FIG. 8 is a timing diagram illustrating clock signals that may be applied to the amplifier of FIG. 7 according to an embodiment of the present invention.

FIG. 8 is a timing diagram illustrating clock signals that may be applied to the switches of the amplifier 800 according to an embodiment of the present invention. Switch $S_{21}$ may be controlled by a 50% duty cycle clock $CLK_{21}$ having a predetermined clock rate. The characteristics of the other clock signals in FIG. 8 are described with reference to the $CLK_{21}$ signal, which shall be called the "base clock" for the instant discussion. Switches $S_{22}$ and $S_{23}$ also may be controlled by 50% duty cycle clocks having the same rate as the base clock $CLK_{21}$. The clock $CLK_{22}$ for switch $S_{22}$ may be inverted with respect to the base clock $CLK_{21}$ (or rendered out-of-phase with respect to it). The clock $CLK_{23}$ for switch $S_{23}$ simply may be a replica of the base clock.

The clock $CLK_{24}$ for switch $S_{24}$ may be a pulsed clock having a period that is twice the period of the base clock $CLK_{21}$. The clock $CLK_{24}$ may be high at all times except one half a clock cycle of the base clock. In the exemplary timing diagram of FIG. 8, the $CLK_{24}$ signal is shown as low during time $T_{23}$.

Clock $CLK_{25}$ controls switch $S_{25}$. It may be a 50% duty cycle clock that has a period that is twice the period of the base clock $CLK_{21}$. In the exemplary embodiment of FIG. 8, the $CLK_{25}$ clock is shown as high during times $T_{20}$ and $T_{21}$ and low during times $T_{22}$ and $T_{23}$.

Clock $CLK_{26}$ controls switch $S_{26}$. It also may be a 50% duty cycle clock that has a period that is twice the period of the base clock $CLK_{21}$. The $CLK_{26}$ is inverted with respect to the $CLK_{25}$ clock (or out-of-phase with respect to it).

Clock $CLK_{27}$ controls switch $S_{27}$. $CLK_{27}$ also may be a pulsed clock, one that has a period that is twice as long as the period of $CLK_{21}$. $CLK_{27}$ is shown as high at all times except during one half a clock cycle of the base clock. $CLK_{27}$ is out-of-phase with respect to the $CLK_{24}$ clock by one half of its period. Thus, in the exemplary timing diagram of FIG. 8, the $CLK_{27}$ signal is shown as low during time $T_{21}$.

Clock CLK28 controls switch $S_{28}$. Clock CLK28 controls switch $S_{28}$. It may be a 50% duty cycle clock that has a period that is twice the period of the base clock CLK21. The CLK28 clock is out-of-phase with respect to the CLK25 clock by a full cycle of the base clock CLK21. In the exemplary embodiment of FIG. 8, the CLK28 clock is shown as high during times $T_{20}$ and $T_{21}$ and low during times $T_{22}$ and $T_{23}$.

Clock CLK29 controls switch $S_{29}$. It also may be a 50% duty cycle clock that has a period that is twice the period of the base clock CLK21. The CLK29 is inverted with respect to the CLK25 clock (or out-of-phase with respect to it). The CLK29 clock also may be out-of-phase with respect to the CLK26 clock by a full cycle of the base clock CLK21.

TABLE 2

|  | $T_{20}$ | $T_{21}$ | $T_{22}$ | $T_{23}$ | $T_{24}$ |
|---|---|---|---|---|---|
| Switch $S_{21}$ | Open | Closed | Open | Closed | Open |
| Switch $S_{22}$ | Closed | Open | Closed | Open | Closed |
| Switch $S_{23}$ | Open | Closed | Open | Closed | Open |
| Switch $S_{24}$ | Open | Open | Open | Closed | Open |
| Switch $S_{25}$ | Open | Closed | Closed | Open | Open |
| Switch $S_{26}$ | Closed | Open | Closed | Closed | Closed |
| Switch $S_{27}$ | Open | Closed | Open | Open | Open |
| Switch $S_{28}$ | Closed | Open | Open | Closed | Closed |
| Switch $S_{29}$ | Open | Closed | Open | Open | Open |

FIG. 9 illustrates circuit response at time $T_{20}$ according to an embodiment of the invention. The switches cause the amplifier 800 to be divided into multiple sub-circuits 900, 910 and 920 that are isolated from one another.

A first sub-circuit 1000 includes the input capacitor 850. Switches $S_1$ and $S_3$ each a closed creating a conductive path from $V_{in}$ to ground. The input capacitor 850 precharges during time $T_{20}$.

A second sub-circuit 1010 may extend from the load capacitor to ground via one of the capacitors 870. Switches $S_{23}$, $S_{27}$ and $S_{29}$ each may be closed to establish the conductive path of this second sub-circuit. During time $T_{20}$, a voltage developed across the output capacitor 870 may be held for the load capacitor.

A third sub-circuit 1020 may be formed around the second output capacitor 860, placing both terminals 900, 910 thereof at ground. This third sub-circuit 1020 discharges the second capacitor 860 in anticipation of an evaluation phase.

During time $T_{20}$, switches $S_{22}$, $S_{26}$ and $S_{28}$ may be open to sever conductive paths between the sub-circuits. In the illustration of FIG. 9, node 890 is shown as being shared among the three sub-circuits 1000, 1010 and 1020. If desired, additional isolating switches may be introduced to the amplifier 800 to further isolate the sub-circuits.

FIG. 10 illustrates circuit response at time $T_{21}$ according to an embodiment of the present invention. During this time, switches $S_{22}$, $S_{24}$ and $S_{26}$ may be closed, establishing a conductive path between the $V_{ref}$ input terminal and the output terminal 920 of the op amp 810 traversing the output capacitor 860. During time $T_{21}$, the amplifier evaluates, causing a voltage to be created across the output capacitor 860 according to:

$$V_{out} = \frac{C_1}{C_{out}}(V_{in} - V_{ref}) \qquad (2)$$

where $C_1$ is the combined capacitance of the one or more input branches 820–840.

During time $T_{21}$, the switches $S_{21}$, $S_{23}$, $S_{25}$, $S_{27}$, $S_{28}$ and $S_{29}$ may be open. These switches isolate the $V_{in}$ terminal, the second output capacitor 870 and ground from the evaluation path shown in FIG. 10.

FIG. 11 illustrates circuit response at time $T_{20}$ according to an embodiment of the invention. The switches cause the amplifier 800 to be divided into multiple sub-circuits 900, 910 and 920 that are isolated from one another.

A first sub-circuit 1200 includes the input capacitor 850. Switches $S_1$ and $S_3$ each a closed creating a conductive path from $V_{in}$ to ground. The input capacitor 850 precharges during time $T_{20}$.

A second sub-circuit 1210 may extend from the load capacitor to ground via one of the capacitors 870. Switches $S_{23}$, $S_{27}$ and $S_{29}$ each may be closed to establish the conductive path of this second sub-circuit. During time $T_{20}$, a voltage developed across the output capacitor 870 may be held for the load capacitor.

A third sub-circuit 1220 may be formed around the second output capacitor 860, placing both terminals 900, 910 thereof at ground. This third sub-circuit 1220 discharges the second capacitor 860 in anticipation of an evaluation phase.

During time $T_{20}$, switches $S_{22}$, $S_{26}$ and $S_{28}$ may be open to sever conductive paths between the sub-circuits. In the illustration of FIG. 11, node 890 is shown as being shared among the three sub-circuits 1200, 1210 and 1220. If desired, additional isolating switches may be introduced to the amplifier 800 to further isolate the sub-circuits.

FIG. 12 illustrates circuit response at time $T_{21}$ according to an embodiment of the present invention. During this time, switches $S_{22}$, $S_{24}$ and $S_{26}$ may be closed, establishing a conductive path between the $V_{ref}$ input terminal and the output terminal 920 of the op amp 810 traversing the output capacitor 860. During time $T_{21}$, the amplifier evaluates, causing a voltage to be created across the output capacitor 860 according to:

$$V_{out} = \frac{C_1}{C_{out}}(V_{in} - V_{ref}) \qquad (3)$$

During time $T_{21}$, the switches $S_{21}$, $S_{23}$, $S_{25}$, $S_{27}$, $S_{28}$ and $S_{29}$ may be open. These switches isolate the $V_{in}$ terminal, the second output capacitor 870 and ground from the evaluation path shown in FIG. 12.

In the discussion of FIGS. 1–12, it has been assumed that the various switches are rendered conductive in response to a high clock state. Such switches may be provided, for example, as switching transistors of the PMOS. Of course, it will be appreciated that an identical circuit response may be achieved by using complementary switching types (such as NMOS transistors) and also inverting the signal levels of the various clocks input thereto. Thus, the selection of device types and clocking schemes may be varied to suit individual design needs and to integrate different embodiments of the amplifiers into a larger overall design.

The switched capacitor amplifiers described in connection with the foregoing embodiments are useful in high-bandwidth applications such as pipestaged circuits. In a pipestaged circuit, a series of circuit elements typically are provided in a cascaded series. Input data signals are presented to an input of a first circuit element during a predetermined phase of a driving clock signal. The first circuit element presents output signal(s) to an input of a second circuit element at a predetermined time later, typically at the next clock cycle. During this second clock cycle, new input signals are presented to the input of the first circuit element for a second iteration of processing. Thus, during each clock cycle, it is expected that new input data may be presented to the cascaded circuit. Data input during prior clock cycles essentially "march" though the cascaded series of circuit elements, each data element advancing from one circuit stage to the next during each clock cycle, until the data reach a terminal circuit element and exits the pipestaged circuit.

The amplifiers described in the foregoing embodiments are particularly suited to pipestaged applications. As shown in Table 3 below, data may be input to and output from the amplifier during every cycle of a driving clock. Thus, while the individual capacitors advance through a precharge-evaluation-hold progression that is distributed across multiple clock cycles, the amplifier as a whole may be integrated with a pipestage circuit having timing requirements that require single cycle operation.

TABLE 3

|  | Clock Cycle n | | Clock Cycle n + 1 | | Clock Cycle n + 2 | |
| --- | --- | --- | --- | --- | --- | --- |
|  | Phase 1 | Phase 2 | Phase 1 | Phase 2 | Phase 1 | Phase 2 |
| Input Terminal ($V_{ref}$) | New Data Presented | — | New Data Presented | — | New Data Presented | — |
| Output Terminal | Output Data Presented | — | Output Data Presented | — | Output Data Presented | — |
| First Capacitor | Precharge | Evaluation | Hold | — | Precharge | Evaluation |
| Second Capacitor | Hold | — | Precharge | Evaluation | Hold | — |

Figure 13:
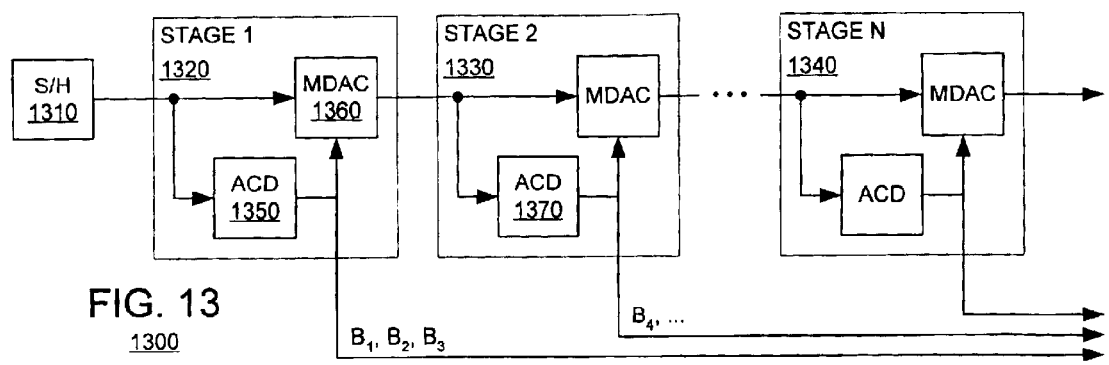
FIG. 13 is a block diagram of a pipestaged analog to digital converter according to an embodiment of the present invention.

FIG. 13 is a block diagram of a pipestaged analog to digital converter ("ADC") 1300 according to an embodiment of the present invention. The ADC 1300 may include a sample/hold circuit ("S/H") 1310 and a cascaded series of converter pipestages 1320–1340. Of course, while only three pipestages 1320–1340 are illustrated in FIG. 13, the number of pipestages may vary as may be desired to meet individual design criterion. Each converter pipestage (say, 1320) may include an ADC block 1350 and a multiplier/digital to analog converter bloc 1340. ADC blocks 1350 are known per Se, they sample input analog voltages and generate binary signal representing the magnitude thereof to within a predetermined granularity. For example, an ADC block 1350 may be configured to generate a three bit digital signal (bits $B_1$, $B_2$ and $B_3$ for example) representing an input analog voltage in a range between zero and one volt.

MDAC blocks 1360 also are known per se. An MDAC scales an input analog voltage by a predetermined scaling factor and generates an output analog voltage that represents a different between the scaled input voltage and a voltage represented by the binary digits output from the corresponding ADC block 1350.

Continuing the example provided above, an ADC 1350 that samples a 1 volt range and generates a three bit digital output therefrom can detect voltage differences within 0.125 of a volt ($1/2^3$ volts). Hypothetically, if an input signal of ⅔ volts were input to the first pipestage 1320, the ADC would generate a digital pattern of "101," representing ⅝ of a volt, the closest value that the ADC can detect that is below the voltage of the input signal. Based on the "101" value output from the ADC, the MDAC subtracts 0.625 volts from the original input voltage and scales the remainder according to the sampling range of the ADC in the next pipestage 1330. For example, if the next ADC also is configured to sample an input potential between zero and one volts, the MDAC 1360 may scale the remainder by a factor of eight:

$$V_{out} 8*(V_{in}-V_{ADC}) \quad (4)$$

A comparison between equations 1–3 and equation 4 demonstrates that the desired scaling may be accomplished by varying relative values of the input and output capacitors.

In equation 4, the $V_{ADC}$ term may vary from clock cycle to clock cycle; the $V_{ref}$ term of equations 1–3 do not. However, corresponding variations in the $V_{ref}$ term may be introduced thereto. Returning to FIG. 1, it may be seen that, in each input branch, the coupling between the $V_{ref}$ potential and the input capacitor 150 via a control switch $S_2$. To accommodate the varying reference potential of equation 4, the switch $S_2$ of each input branch may be controlled by a signal that is a logical combination of the clock signal $CLK_2$ and one of the bit signals output from the ADC 1370. Equation 1, for example, becomes:

$$V_{out} = \frac{C_1 + C_{out}}{C_{out}} \sum_{i=1}^{N} (V_{in} - B_i \cdot V_{ref}), \quad (5)$$

where $B_i=1$ or 0 and N represents the number of input branches of the amplifier. The amplifier of FIG. 7 and equations 2 and 3 may be modified similarly. Equations 2 and 3 become:

$$V_{out} = \frac{C_1}{C_{out}} \sum_{i=1}^{N} (V_{in} - B_i \cdot V_{ref}) \quad (6)$$

again, where $B_i=1$ or 0 and N represents the number of input branches of the amplifier.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A switched capacitor amplifier, comprising:
   an operational amplifier having a pair of input terminals and an output terminal;
   a pair of capacitors, each coupled to the same input terminal and to the output terminal;
   an input branch circuit; and
   control means, governed by a clock signal, to create logical circuits from the input branch circuit and the, two capacitors, in which:
      during a first clock cycle, the logical circuits comprise a precharge circuit path traverses the input branch and one of the capacitors and an evaluation circuit path traverses the second capacitor, and
   during a second clock cycle, the logical circuits comprise a precharge circuit path traverse the input branch and the second capacitor and the an evaluation circuit path traverses the first capacitor.

2. A method of controlling a switched capacitor amplifier, comprising:
   during a first clock cycle:
      precharging a first output capacitor, and
      driving an output terminal from a second output capacitor; and during a second clock cycle:
      precharging the second output capacitor, and
      driving the output terminal from the first output capacitor.

3. The method of claim 2, wherein during the precharging steps, the respective precharging capacitor is electrically isolated from the output terminal.

4. The method of claim 2,
wherein the precharging of the first output capacitor during the first clock cycle is performed by placing the first output capacitor in parallel with one or more input capacitors, and
wherein the precharging of the second output capacitor during the second clock cycle is performed placing the second output capacitor in parallel with the one or more input capacitors.

5. The method of claim 2, further comprising:
during the first clock cycle:
adjusting the voltage of the first output capacitor based on values of one or more first digital input bits, after the first output capacitor is precharged;
during the second clock cycle:
adjusting the voltage of the second output capacitor based on values of one or more second digital input bits, after the second output capacitor is precharged.

6. The method of claim 5,
wherein the voltage of the first input capacitor is adjusted during the first clock cycle by subtracting a first digitally-controlled voltage from a first precharge voltage, the first precharge voltage being determined by an input voltage, and the first digitally controlled voltage being determined by a reference voltage and the values of the one or more first digital input bits, and
wherein the voltage of the second input capacitor is adjusted during the second clock cycle cycle by subtracting a second digitally-controlled voltage from a second precharge voltage, the second precharge voltage being determined by the input voltage, and the second digitally-controlled voltage being determined by the reference voltage and the values of the one or more second digitally-controlled voltage being determined by the reference voltage and the values of the one or more second digital input bits.

7. A digital-to-analog converter, comprising:
an input circuit selectively receiving one of an input voltage and a reference voltage;
an operational amplifier;
first and second circuit paths, each selectively connected to the input circuit and the operational amplifier, each capable of functioning as a first or second precharge circuit path or a first or second output circuit path, respectively;
wherein when the first circuit path operates as a first precharge circuit path, the second circuit path operates as a second output circuit path, and
wherein when the second circuit path operates as a second precharge circuit path, the first circuit path operates as a first output circuit path.

8. The digital-to-analog converter of claim 7, wherein the first and second circuit paths can function as first and second evaluation circuit paths, respectively.

9. The digital-to-analog converter of claim 8,
wherein when the first circuit path operates as a first elevation circuit path, the second circuit path is isolated, and
wherein when the second circuit path operates as a second evaluation circuit path, the first circuit path is isolated.

10. The digital-to-analog converter of claim 8,
wherein the first circuit path comprises a first circuit path capacitor, and
wherein the second circuit path comprises a second circuit path capacitor.

11. The digital-to-analog converter of claim 10, wherein
when the first circuit path operates as a first precharging circuit, the first circuit path capacitor is charged to a first precharge voltage corresponding to an input voltage;
when the first circuit path operates as a first evaluation circuit the first circuit path capacitor is charged to a first output voltage corresponding to the input voltage minus a first digitally-controlled voltage, the first digitally-controlled voltage being determined by a reference voltage and values of the one or more first digital input bits, and
when the first circuit path operates as a first output circuit the first circuit path capacitor provides the first output voltage for sampling at an output of the operational amplifier.

12. The digital-to-analog converter of claim 11, wherein
when the second circuit path operates as a second recharging circuit, the second circuit path capacitor is charged to a second precharge voltage corresponding to the input voltage;
when the second circuit path operates as a second evaluation circuit the second circuit path capacitor is charged to a second output voltage corresponding to the input voltage minus a second digitally-controlled voltage, the second digitally-controlled voltage being determined by the reference voltage and values of the one or more second digital input bits, and
when the second circuit path operates as a second output circuit the second circuit path capacitor provides the second output voltage for sampling at the output of the operational amplifier.

13. The digital-to-analog converter of claim 10,
wherein when the first circuit path operates as a first precharge path, the first circuit path capacitor is connected in parallel with the input circuit between an input voltage and ground, and
wherein when the first circuit path operates as a first output path, the first circuit path capacitor is connected between an input terminal of the operational amplifier and an output terminal of the operational amplifier.

14. The digital-to-analog converter of claim 13,
wherein when the second circuit path operates as a second precharge path the second circuit path capacitor is connected in parallel with the input circuit between the input voltage and ground, and
wherein when the second circuit path operates as a second output path the second circuit path capacitor is connected between the input terminal of the operational amplifier and the output terminal of the operational amplifier.

15. The digital-to-analog converter of claim 7, wherein the input section further comprises:
an input capacitor connected between an intermediate node and the output node;
a first input switch connected between the first reference voltage and the intermediate node; and
a second input switch connected between the second reference voltage and the intermediate node.

16. The digital-to-analog converter of claim 7,
wherein the first circuit path comprises a first circuit path capacitor, and
wherein the second circuit path comprises a second circuit path capacitor.

17. A switched capacitor amplifier, comprising:

an operational amplifier having a pair of input terminals and an output terminal;

first and second capacitors, each coupled to the same input terminal and to the output terminal;

an input branch circuit; and control means, governed by a clock signal, to create logical circuits from the input branch circuit and the first and second capacitors, in which:

during a first clock cycle, the logical circuits comprise a first precharge circuit path that traverses the input branch and the first capacitor, and a first output circuit path that traverses the second capacitor, and during a second clock cycle, the logical circuits comprise a second precharge circuit path that traverses the input branch and the second capacitor, and a second output circuit path that traverses the first capacitor.

* * * * *

UNITED STATES PATENT AND TRADEMARK OFFICE
CERTIFICATE OF CORRECTION

| | | |
|---|---|---|
| PATENT NO. | : 6,838,930 B2 | Page 1 of 1 |
| APPLICATION NO. | : 10/305067 | |
| DATED | : January 4, 2005 | |
| INVENTOR(S) | : Phuong T. Huynh | |

It is certified that error appears in the above-identified patent and that said Letters Patent is hereby corrected as shown below:

In Column 10, Line 45, Claim No. 1:
    Change "and the," to --and the--

In Column 11, Line 28, Claim No. 6:
    Change "clock cycle cycle by" to --clock cycle by--

In Column 11, Line 34-Line 36, Claim No. 6:
    Remove "more second digitally-controlled voltage being determined by the reference voltage and the values of the one or"

Signed and Sealed this

Fifth Day of August, 2008

JON W. DUDAS
*Director of the United States Patent and Trademark Office*